United States Patent [19]

Torikai

[11] Patent Number: 5,179,430
[45] Date of Patent: Jan. 12, 1993

[54] PLANAR TYPE HETEROJUNCTION AVALANCHE PHOTODIODE

[75] Inventor: Toshitaka Torikai, Tokyo, Japan
[73] Assignee: NEC Corporation, Tokyo, Japan
[21] Appl. No.: 680,617
[22] Filed: Apr. 2, 1991

Related U.S. Application Data

[63] Continuation of Ser. No. 356,108, May 24, 1989, abandoned.

[30] Foreign Application Priority Data

May 24, 1988 [JP] Japan .................. 63-127821

[51] Int. Cl.$^5$ .................. H01L 31/10; H01L 27/14
[52] U.S. Cl. .................. 257/186; 257/438
[58] Field of Search .............. 357/30 A, 30 F, 16, 357/13

[56] References Cited

U.S. PATENT DOCUMENTS

| 4,212,019 | 7/1980 | Wataze | 357/30 |
|---|---|---|---|
| 4,389,534 | 6/1983 | Winterling | 357/30 |
| 4,481,523 | 11/1984 | Osaka et al. | 357/13 |
| 4,608,586 | 8/1986 | Kim | 357/30 A |
| 4,651,187 | 3/1987 | Sugimoto et al. | 357/52 |
| 4,794,439 | 12/1988 | Webb et al. | 357/30 A |
| 4,949,144 | 8/1990 | Kuroda et al. | 357/30 |

FOREIGN PATENT DOCUMENTS

| 0145316 | 6/1986 | European Pat. Off. |  |
| 0325532 | 7/1989 | European Pat. Off. |  |
| 0343970 | 11/1989 | European Pat. Off. | 357/13 |
| 3631248 | 3/1988 | Fed. Rep. of Germany | 357/30 A |
| 2252653 | 6/1975 | France |  |
| 2406895 | 6/1979 | France | 357/30 A |
| 56-080179 | 1/1981 | Japan | 357/30 A |
| 57-95681 | 6/1982 | Japan | 357/30 |
| 57-113292 | 7/1982 | Japan | 357/30 A |
| 57-199274 | 12/1982 | Japan | 357/30 |
| 2107118 | 4/1983 | United Kingdom | 357/13 |

OTHER PUBLICATIONS

Campbell et al., InP/InGaAsP/InGaAs avalanche photodiodes with 70 GHz gain-bandwidth product, Nov. 2, 1987, Appl. Phys. Lett 51(18), p. 1454.
Chi et al., Planar avalanche photodiode w/a low--doped, reduced curvature junction, Dec. 22, 1986, 1987 American Instit. of Physics, Apr. 27, 1987, p. 1158.
Chi et al, "Planar InP/InGaAsP Three-Dimensional . . . Avalanche Photodiode", IEEE Transactions on Electron Devices, vol. ED-34, No. 11, Nov. 1987, pp. 2265-2269.

Primary Examiner—Jerome Jackson, Jr.
Attorney, Agent, or Firm—Sughrue, Mion, Zinn, Macpeak & Seas

[57] ABSTRACT

In a planar type heterojunction avalanche photodiode comprising a light absorbing layer of a first conduction type provided on a substrate of the first conduction type, an avalanche multiplication layer of the first conduction type provided on a side of the light absorbing layer which is opposite to the substrate, and a conduction region of a second conduction type in contact with the avalanche multiplication layer, a high reflection film is provided on a side of the conduction region which is opposite to the avalanche multiplication layer. An anti-reflection film to which light is supplied is provided on a side of the substrate which is opposite to the light absorbing layer. The light is absorbed in the light absorbing layer substantially, and the remaining light which is not absorbed in the light absorbing layer is reflected by the high reflection layer. The reflected light is absorbed in the light absorbing layer. Consequently, both a wide bandwidth and a high sensitivity are obtained.

4 Claims, 4 Drawing Sheets

FIG. I PRIOR ART

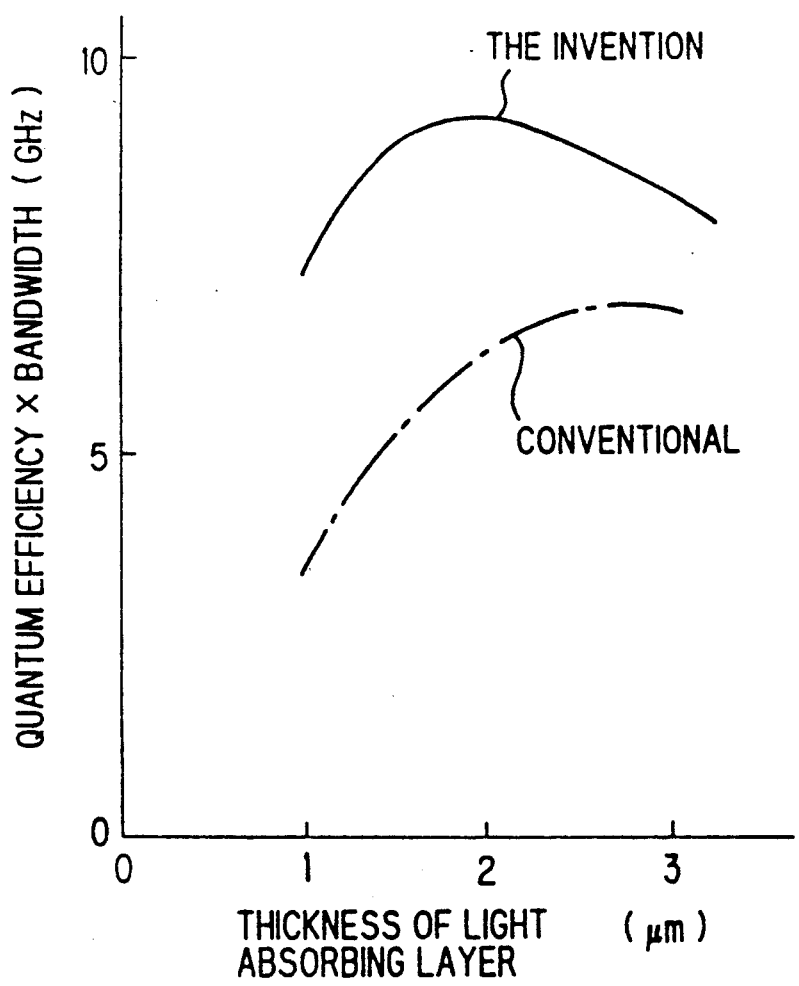

PLANAR TYPE HETEROJUNCTION AVALANCHE PHOTODIODE

This is a continuation of application No. 07/356,108 filed May 24, 1989, now abandoned.

FIELD OF THE INVENTION

The invention relates to a planar type heterojunction avalanche photodiode, and more particularly to an avalanche photodiode which is used for a photodetector having a wide bandwidth and a high sensitivity in optical communication systems etc.

BACKGROUND OF THE INVENTION

One type of a planar type heterojunction avalanche photodiode is disclosed in the U.S. Pat. No. 4,651,187. In the planar type heterojunction avalanche photodiode, an n-InP buffer layer, an $n^-$-$In_{0.53}Ga_{0.47}As$ light absorbing layer, an n-InGaAsP intermediate band-gap layer, an n-InP avalanche multiplication layer, and an $n^-$-InP- cap layer are successively provided on an n-InP substrate. Further, a $p^+$-InP region is preferentially provided in the avalanche multiplication layer and the cap layer, and the $p^+$-InP region is surrounded at its outer periphery by a $p^-$-InP guard ring region. A p-ring shaped electrode and an anti reflection film are provided on the top surface of the cap layer and the $p^+$-InP region, and an n- electrode is provided on the back surface of the substrate.

In operation, a reverse bias voltage is applied across the p-and n-electrodes, and light is supplied to the top surface of the anti-reflection film. Thus, electron and hole carriers are excited in the light absorbing layer, so that hole carriers are injected into the avalanche multiplication layer to result in carrier multiplication.

In the avalanche photodiode of a top surface illumination type as described above, a wide bandwidth characteristic is obtained in a case where the light absorbing layer, the intermediate band-gap layer, and the avalanche multiplication layer become thin in total thickness to shorten a carrier transit time, during which carriers produced in the light excitation and the light multiplication transit through the three layers. In this respect, the light absorbing layer and the avalanche multiplication layer are desired to be thinner because the intermediate band-gap layer is originally thin, that is, a carrier transit time is negligible in the intermediate band-gap layer. The wide bandwidth characteristic is further obtained in a case where an area of the $p^+$-InP region and the $p^-$-InP guard ring becomes small to lower a junction capacitance.

In the planar type heterojunction avalanche photodiode, however, there is a disadvantage that the sensitivity is deteriorated because the quantum efficiency is lowered, when the light absorbing layer is made thin to shorten the aforementioned carrier transit time. There is a further disadvantage that a predetermined reduction of a junction capacitance is difficult even if an area of the p-ring shaped electrode becomes small, because a lead wire electrode pad is provided to connect a lead wire electrically to the p-ring shaped electrode. The reduction of the junction area is also difficult, because the light supplying surface and the lead wire electrode pad are positioned on the common top surface of the avalanche photodiode.

SUMMARY OF THE INVENTION

Accordingly, it is an object of the invention to provide a planar type heterojunction avalanche photodiode having a wide bandwidth and a high sensitivity, for instance, in optical communication systems.

According to the invention, a planar type heterojunction avalanche photodiode comprises, a light absorbing layer of a first conduction type provided on a side of a substrate of a first conduction type, the light absorbing layer having a predetermined band-gap energy;

an avalanche multiplication layer of the first conduction type provided on a side of the light absorbing layer which is opposite to the substrate, the avalanche multiplication layer having a band-gap energy wider than the predetermined band-gap energy;

a conduction region of a second conduction type in contact with the avalanche multiplication layer;

a high reflection film provided on a side of the conduction region which is opposite to the avalanche multiplication layer;

an anti-reflection film provided on a side of the substrate which is opposite to the light absorbing layer, the anti-reflection film facing the high reflection film; and p- and n-electrodes connected to the conduction region and the substrate, respectively.

BRIEF DESCRIPTION OF DRAWINGS

The invention will be explained in more detail in conjunction with appended drawings wherein, FIG. 4 is a graphical diagram explaining a relation between a thickness of a light absorbing layer and a bandwidth- quantum efficiency product in the planar type heterojunction avalanche photodiode of FIG. 2.

DESCRIPTION OF PREFERRED EMBODIMENTS

Figure 1:
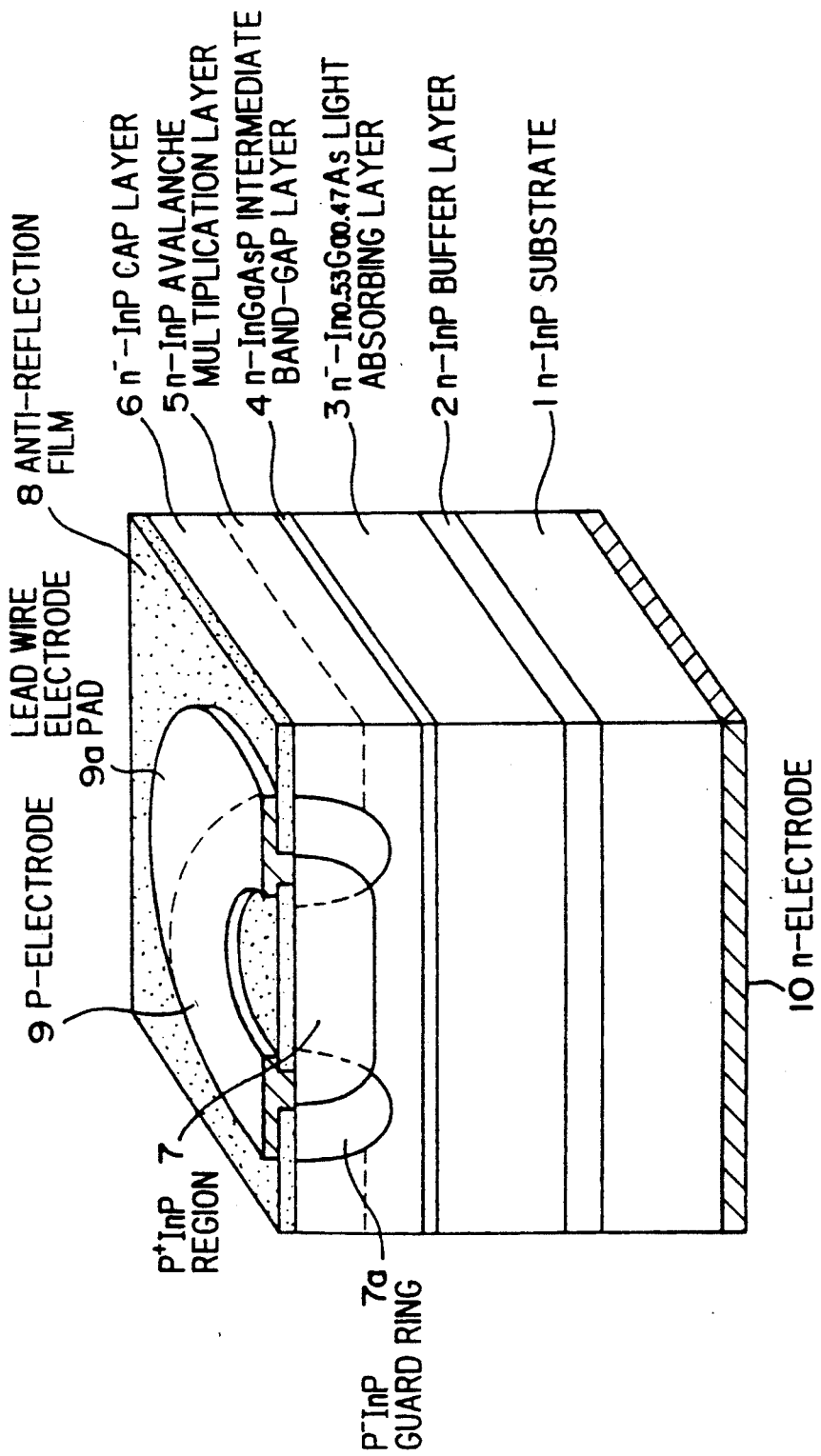
FIG. 1 is a cutaway cross sectional view illustrating a conventional planar type heterojunction avalanche photodiode which is vertically divided to show its cross section.

Before explaining a planar type heterojunction avalanche photodiode in an embodiment according to the invention, the aforementioned conventional planar type heterojunction avalanche photodiode will be explained in FIG. 1. The conventional planar type heterojunction avalanche photodiode comprises an n-InP substrate 1, an n-InP buffer layer 2, an $n^-$-$In_{0.53}Ga_{0.47}As$ light absorbing layer 3, an n-InGaAsP intermediate band-gap layer 4, an n-InP avalanche multiplication layer 5, and an $n^-$-InP cap layer 6. The conventional planar type heterojunction avalanche photodiode further comprises a $p^+$-InP region 7 preferentially provided in the cap layer 6 and the avalanche multiplication layer 5 to form $p^+n$ junction front, a $p^-$-InP guard ring region 7a surrounding the outer periphery of the InP region 7, an anti-reflection film 8 provided on the top surface of the cap layer 6, a p-ring shaped electrode 9 connected through a hole of the anti-reflection film 8 to the InP region 7, a lead wire electrode pad 9a for connecting a lead wire electrically to the p- ring shaped electrode 9 and having an area of $7 \times 10^{-6}$ to $2 \times 10^{-5} cm^2$ which is a minimum value, and an n-electrode 10 provided on the back surface of the substrate 1. In the conventional planar type heterojunction avalanche photodiode, a thickness of the intermediate band-gap layer 4 is as thin as 0.1 to 0.3 μm, so that a carrier transit time is negligible in the intermediate band-gap layer 4. On the contrary, a thickness of the light absorbing layer 3 is 2 to 5 μm, and that of the avalanche multiplication layer 5 is 1 to 2 μm. Therefore, a carrier transit time is desired to be shortened as described before. Operation and other disadvantages of the conventional planar type heterojunction avalanche photodiode are not explained here.

Next, a planar type heterojunction avalanche photodiode in an embodiment according to the invention will be explained in FIG. 2, wherein like parts are indicated by like reference numerals of FIG. 1. In the planar type heterojunction avalanche photodiode, a thickness of an n$^-$-In$_{0.53}$Ga$_{0.47}$As light absorbing layer 3 is 1.5 to 2.0 μm which is half the thickness of the conventional planar type heterojunction avalanche photodiode, and those of an n InGaAsP intermediate band gap layer 4 and an n-InP avalanche multiplication layer 5 are 0.4 μm, and 0.5 to 0.8 μm, respectively, wherein the light absorbing layer 3 can receive light having a wavelength of up to 1.65 μm, and the intermediate band-gap layer 4 and the avalanche multiplication layer 5 have band-gap energies corresponding to wavelengths of 1.15 μm and 0.93 μm, respectively. Further, an anti-reflection film 8 is preferentially provided on the back surface of an n-InP substrate 1, such that the anti-reflection film 8 is positioned to face a p$^+$-InP region 7, and a dielectric film 8a having a thickness of $(2m-1)\lambda/4$ is provided on the surface of the p$^+$-InP region 7, where $\lambda$ is a wavelength of light supplied to the anti-reflection film 8, and m is a positive integer (m=1, 2, 3 ... ). Still further, a p-circular metal electrode 9 is provided to constitute a high reflection region 8c in cooperation with the dielectric film 8a.

In operation, a reverse bias voltage is applied across the p- and n-electrodes 9 and 10, and light having a wavelength of 1.55 μm is illuminated to the anti-reflection film 8, so that light is passed through the substrate 1 and the buffer layer 2 to the light absorbing layer 3 which is thinner as compared to the conventional one. The light is mostly absorbed in the light absorbing layer 3, however the fraction of the light is passed to the high reflection region 8c, and then reflected therefrom back to the light absorbing layer 3. Accordingly, the light is totally absorbed in the light absorbing layer 3 to provide a sufficient high quantum efficiency.

In this embodiment, the p-electrode 9 can be circular and combined with the lead wire electrode pad, because the anti-reflection film 8 can be separated on the back surface of the avalanche photodiode. This avoids the necessity of providing the additional lead wire electrode pad 9a, so that a junction area can be smaller to provide a smaller junction capacitance. Consequently, a wide bandwidth characteristic is obtained in the planar type heterojunction avalanche photodiode.

A planar type heterojunction avalanche photodiode according to the invention is fabricated in a following process.

On an n$^+$-InP substrate 1 doped with Sulfer, an n-InP buffer layer 2 having a thickness of approximately 1 μm, an n$^-$-In$_{0.53}$Ga$_{0.47}$As light absorbing layer 3 having a thickness of 1.5 to 2.0 μm and a carrier concentration of 2 to $5 \times 10^{15} cm^{-3}$, an n-InGaAsP intermediate band-gap layer 4 having a thickness of approximately 0.4 μm, an n-InP avalanche multiplication layer 5 having a thickness of 0.5 to 0.8 μm and a carrier concentration of 5 to $7 \times 10^{16} cm^{-3}$, and an n$^-$-InP cap layer 6 having a thickness of 1.5 to 2.0 μm and a carrier concentration of 1 to $5 \times 10^{15} cm^{-3}$ are successively grown at a temperature of 700° C. by a hydride vapor phase epitaxy. The n-InP buffer layer 2 is a layer for avoiding the penetration of defects and dislocations in the InP substrate 1 into the layers 3 to 6, the n$^-$-In$_{0.5}$Ga$_{0.47}$As light absorbing layer 3 is a layer for absorbing light having a wavelength of 1 to 1.65 μm to generate electron and hole carrier pairs, and the n-InPGaAsP intermediate band-gap layer 4 is a layer for avoiding the trap of holes due to the Valence band offset between the light absorbing layer 3 and the avalanche multiplication layer 5.

After the growth of the layer structure in the vapor phase epitaxy as described above, a guard ring region 7a is formed by implanting Be ions into the cap layer 6 and the avalanche multiplication layer 5. That is, a SiO$_2$ film of a thickness of approximately 1 μm is deposited on the cap layer 6 at a temperature of 360° C. by a thermal CVD method. The SiO$_2$ film is preferentially removed in the use of buffered hydrofluoric acid by means of a light exposure mask which has a pattern of a ring drawn by an ordinal light exposure method, and Be ions are injected through a removed portion of the SiO$_2$ film with a dose of $5 \times 10^{13} cm^{-2}$ under an accelerating voltage range of 100 to 140 KV. Then, the remaining SiO$_2$ film is totally removed by use of hydrofluoric acid liquid, and a PSG film having a thickness of approximately 100 μm is deposited at a temperature of 360° C. by the thermal CVD method. Thereafter, a heat treatment of 700° C. is performed for an activation and a Drive-in diffusion of the injected Be ions for twenty minutes, thereby providing the guard ring region 7a. After that, the PSG film is preferentially removed at a portion corresponding to the inside of the guard ring region 7a to form a circular aperture by use of a light exposure mask, and Zn is thermally diffused through the circular removed portion of the PSG film into the cap layer 6 and the avalanche multiplication layer 5 at a temperature of 530° C. for fifteen to twenty minutes, thereby forming the p$^+$-conduction region 7 to provide a pn junction front. Next, the PSG film is removed by use of hydrofluoric acid and a SiN film having a thickness of approximately 180 nm is deposited on the cap layer 6 at a temperature of 300° C. by a plasma enhanced CVD method. The SiN film thus deposited is preferentially removed with a pattern of a ring on the p$^+$-conduction region 7 by an ordinary light exposure method, such that the inside region of the removed ring portion is for a dielectric film 8a of a high reflection region 8c, and the outside region thereof is for a protective film 8b. Then, a p-circular metal electrode 9 of a Ti/Pt/Au multi-layer film is provided on the SiN film and the exposed p$^+$-InP conduction region 7 by an electron bombardment evaporation. On the other hand, the back surface of the substrate 1 is polished to provide a mirror surface on which a SiN film is formed at a temperature of 200° C. by a plasma CVD method. The SiN film is removed except for a region of an anti-reflection film 8 facing the high reflection region 8c. Finally, an n-metal electrode 10 of a AuGe/Ni layer is provided on the removed portion of the SiN film on the back surface of the substrate 1 by a resistance heating evaporation, thereby completing a planar type heterojunction avalanche photodiode according to the invention.

Figure 3:
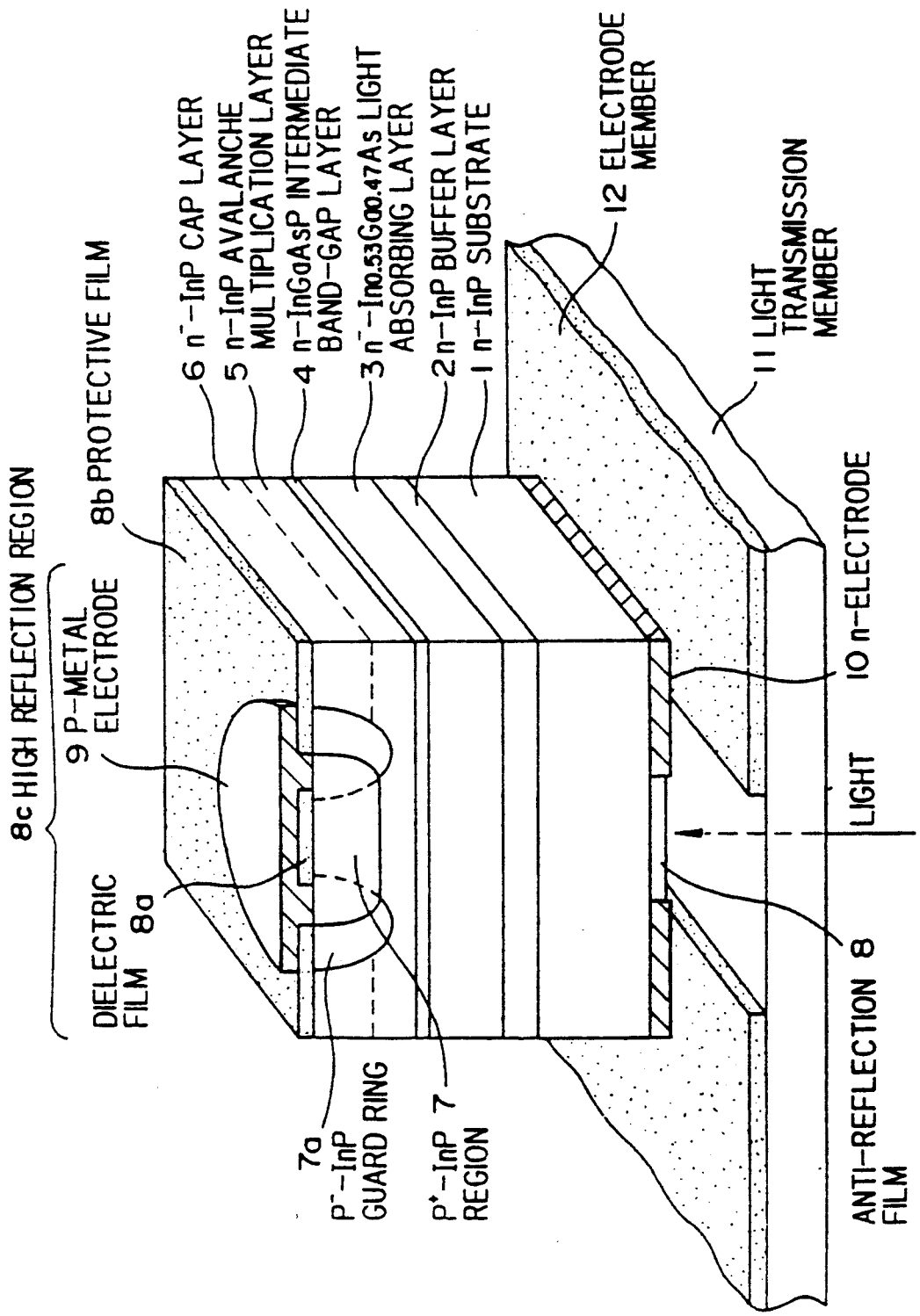
FIG. 3 is a cutaway cross sectional view illustrating a planar type heterojunction avalanche photodiode of FIG. 2 which is provided on a support.

The planar type heterojunction avalanche photodiode (thus) fabricated is mounted on a support including a sapphire support 11 having a thickness of approximately 300 μm and a preferential metal electrode 12 of a Ti/Pt/Au multi-layer as shown in FIG. 3, so that it is easy to supply light to the anti reflection film 8, even if the anti-reflection film 8 is positioned on the back surface of the substrate 1. The sapphire support 11 is selected for a support material, because an absorbing loss is low at a wavelength of 1 to 2 μm, and a light transmission characteristic is flat.

Figure 2:
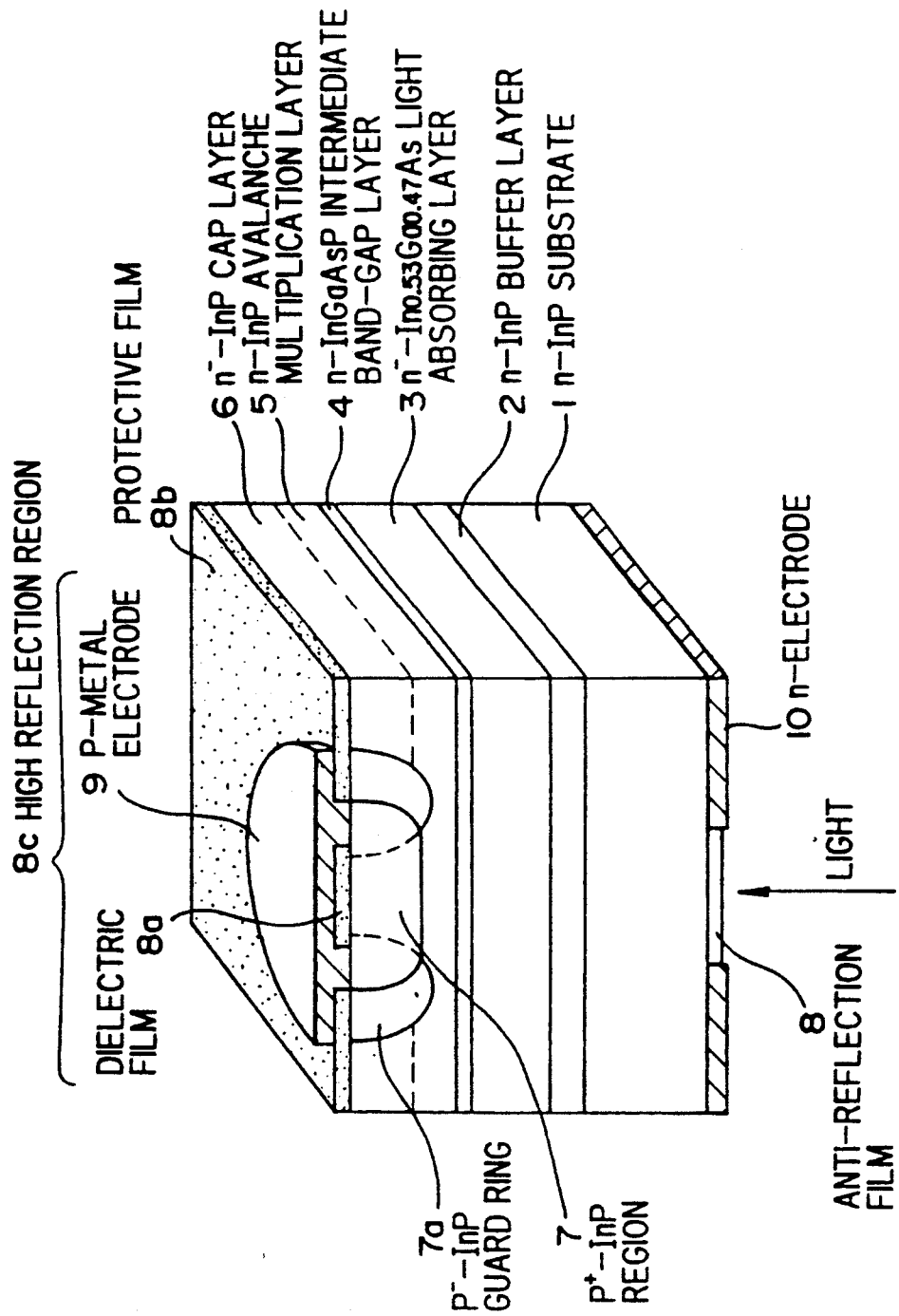
FIG. 2 is a cutaway cross sectional view illustrating a planar type heterojunction avalanche photodiode, which is vertically divided to show its cross section, in an embodiment according to the invention.

In the structure as shown in FIG. 2 or FIG. 3, a bandwidth-quantum efficiency product is measured relative to a thickness of the light absorbing layer 3 as shown in FIG. 4. The bandwidth-quantum efficiency product is appropriate as a figure of merit from which a wide bandwidth characteristic and a high sensitivity characteristic of a planar type heterojunction avalanche photodiode are judged. As clearly understood from the result of FIG. 4 in which a multiplication factor is five, the bandwidth-quantum efficiency product is much improved in a thickness of the light absorbing layer 3 ranging 1 to 3 μm as compared to the conventional planar type heterojunction avalanche photodiode.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. In a planar type heterojunction avalanche photodiode comprising, a light absorbing layer of a first conductivity type provided over one side of a substrate of a first conductivity type, said light absorbing layer having a predetermined band-gap energy;

an avalanche multiplication layer of said first conductivity type provided separated from but over a side of said light absorbing layer which is opposite to a side of said light absorbing layer facing said substrate, said avalanche multiplication layer having a band-gap energy wider than said predetermined band-gap energy;

a semiconductor layer of a second conductivity type in contact with said avalanche multiplication layer;

a high reflection film provided on a side of said semiconductor layer which is opposite to a side of said semiconductor layer which is in contact with said avalanche multiplication layer, said high reflection film including a dielectric film having a thickness of $(2m-1)\cdot\lambda/4$ and a metal film formed thereon, where m is a positive integer and λ the wavelength of light incident to an anti-reflection film;

an anti-reflection film provided on a side of said substrate which is opposite to said light absorbing layer, said anti-reflection film facing said high reflection film; and p- and n-electrodes connected to said semiconductor layer and substrate, respectively.

2. A planar type heterojunction avalanche photodiode according to claim 1;

wherein said p-electrode is circular and forms a part of the metal film of said high reflection film.

3. A planar type heterojunction avalanche photodiode according to claim 1; further comprising, a support including a light transmission member and an electrode member which is preferentially deposited on said light transmission member, said substrate being mounted on said support.

4. A planar type heterojunction avalanche photodiode according to claim 1;

wherein said dielectric film is positioned under said metal film and above said semiconductor layer.

* * * * *